(12) United States Patent
Shao et al.

(10) Patent No.: US 11,497,139 B2
(45) Date of Patent: Nov. 8, 2022

(54) COMPLETE BLIND-MATE CONNECTION SYSTEM FOR LIQUID COOLING

(71) Applicant: Baidu USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 118 days.

(21) Appl. No.: 16/884,969

(22) Filed: May 27, 2020

(65) Prior Publication Data

US 2021/0378141 A1 Dec. 2, 2021

(51) Int. Cl.
*H05K 7/20* (2006.01)
*H05K 7/14* (2006.01)
*H05K 7/12* (2006.01)

(52) U.S. Cl.
CPC ........... *H05K 7/20272* (2013.01); *H05K 7/12* (2013.01); *H05K 7/1452* (2013.01); *H05K 7/20281* (2013.01)

(58) Field of Classification Search
CPC .... H05K 7/20272; H05K 7/12; H05K 7/1452; H05K 7/20281; H05K 7/2079; H05K 7/208
USPC ........................................................ 361/699
See application file for complete search history.

(56) References Cited

U.S. PATENT DOCUMENTS

| 2011/0051372 | A1* | 3/2011 | Barringer | H05K 7/2079 29/890.03 |
| 2012/0300398 | A1* | 11/2012 | Eckberg | H05K 7/2079 165/80.2 |
| 2016/0120059 | A1* | 4/2016 | Shedd | F28D 21/00 165/244 |
| 2017/0280593 | A1* | 9/2017 | Magallanes | H05K 7/20818 |
| 2020/0249732 | A1* | 8/2020 | Nakamura | H05K 7/18 |
| 2020/0296860 | A1* | 9/2020 | Stevens | H05K 7/20609 |

FOREIGN PATENT DOCUMENTS

| JP | 2004363308 A | * 12/2004 |
| KR | 100465088 B1 | * 1/2005 |

* cited by examiner

*Primary Examiner* — Anatoly Vortman
*Assistant Examiner* — Zhengfu J Feng
(74) *Attorney, Agent, or Firm* — Womble Bond Dickinson (US) LLP

(57) ABSTRACT

A holder for an electronic rack includes a pivot point and a first end of the holder having a first blind-mate connector to be coupled to a second blind-mate connector at a first engagement interface. The first blind-mate connector and the second blind-mate connector are coupled in response to the holder moving to the second position in response to contact with the electronic rack. The holder additionally includes a second end of the holder having a third blind-mate connector to be coupled to a fourth blind-mate connector at a second engagement interface. The third blind-mate connector and the fourth blind-mate connector are coupled in response to the holder moving to the second position in response to contact with the electronic rack.

14 Claims, 7 Drawing Sheets

COMPLETE BLIND-MATE CONNECTION SYSTEM FOR LIQUID COOLING

FIELD OF THE DISCLOSURE

Embodiments of the present invention relate generally to data centers. More particularly, embodiments of the invention relate to connection system for liquid cooling of electronic racks in data centers.

BACKGROUND

High performance machine learning computing drives demand for an effective thermal management such as a liquid cooling system. Computing-intensive application scenarios in high-performance machine learning industry includes image classification, object detection, and translation. The liquid cooling system helps reducing the cost and enhancing thermal performance when performing such computing-intensive tasks. The liquid cooling system provides an effective way to solve challenges in thermal management and save the cooling power usage.

In a liquid cooling system, connectors such as barbed fittings are often used to connect an electronic room manifold port and an electronic rack manifold port in the liquid cooling system. However, due to large pipe size and hose bending angle, barbed fittings failure rate as connectors is high. Additionally, barbed fittings failure rate is further exacerbated by other associated technical challenges in transportation, handling, and assembly.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
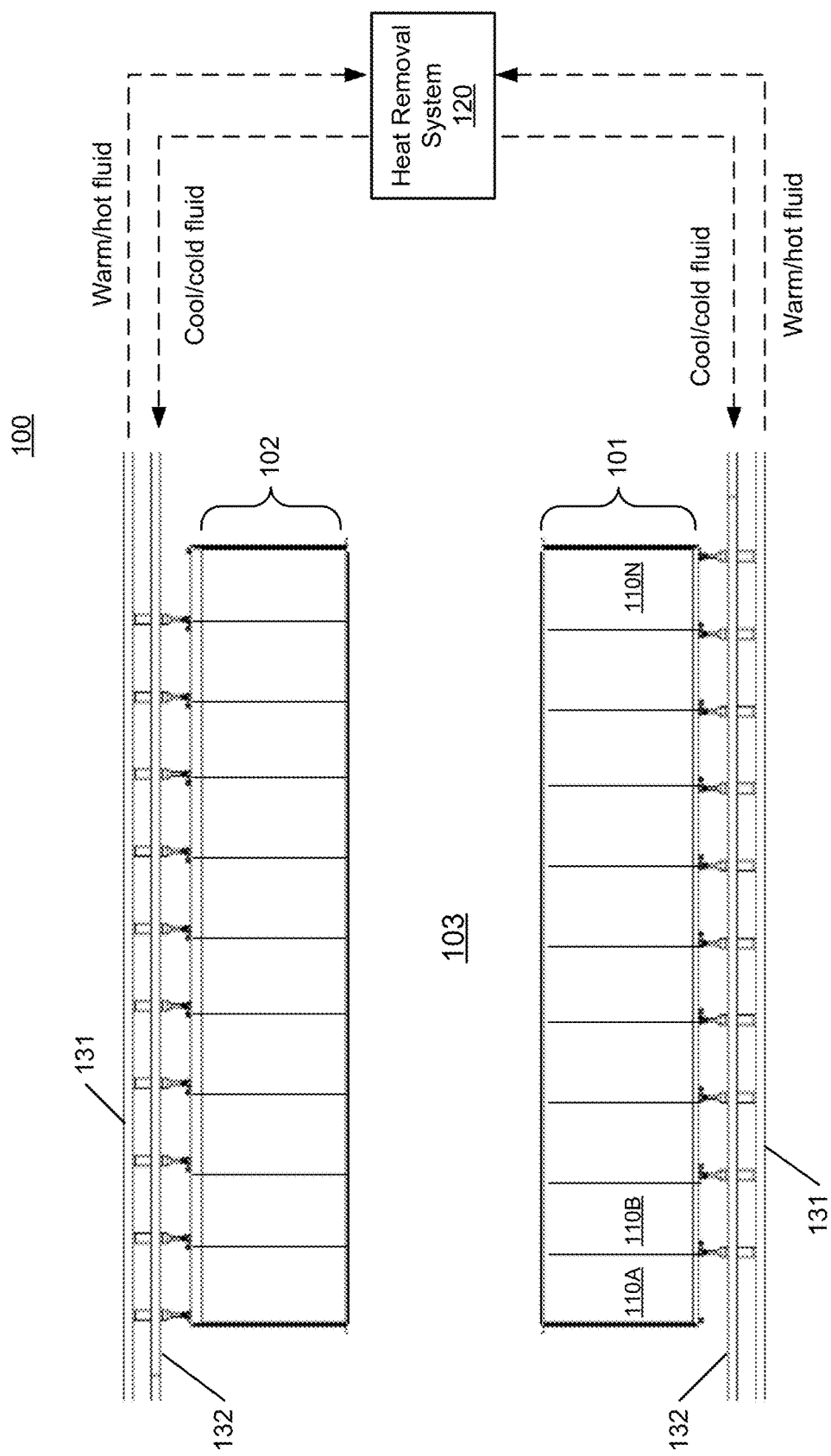
FIG. 1 is a block diagram illustrating an example of a data center system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure focus on an improvement of design of a connecting interface for a liquid-cooled electronic rack in a liquid cooling system. Such connecting interface is utilized to connect electronic racks and a room fluid supply/return system. The concept proposed herein is to design and operate a connecting interface for the liquid-cooled electronic rack using a complete blind-mate interface, a self-engaging mechanism, and a full segregation. A complete blind-mate interface design connects a server chassis to room fluid supply/return system. Such complete blind-mate interface design eliminates the use of flexible hoses and barbed fittings. A self-engaging mechanism utilizing a connector holder or a holder is implemented to couple blind-mate interfaces between a rack manifold and a room manifold.

In particular, the blind-mate interfaces are positioned to couple the holder to the electronic rack and the holder to the room manifold. As the electronic rack is pushed into a designated position in a data center system, for example, the blind-mate interfaces are coupled simultaneously. Accordingly, the holder is coupled to the electronic rack via one of the blind-mate interfaces and the holder is coupled to the room manifold via the other blind-mate interface. The connecting interface design described herein also implements a full segregation design between the room manifold with multiple electronic racks. Disturbance caused during engaging/disengaging operation of an electronic rack to a room manifold can be isolated. As a result, the movement (e.g. vibration) on the room manifold caused by the disturbance during engaging/disengaging operation does not affect a connection integrity of the other electronic racks. This holder is designed for a fast parts replacement during a maintenance operation.

According to one embodiment, a holder for an electronic rack includes a pivot point disposed on a portion of the holder, the pivot point to be coupled to a pivot connector on a panel to pivotally move the holder between a first position and a second position. The holder for the electronic rack includes a first end of the holder having a first blind-mate connector to be coupled to a second blind-mate connector at a first engagement interface, the second blind-mate connector being mounted on a room manifold. The first blind-mate connector and the second blind-mate connector are coupled in response to the holder moving to the second position in response to contact with the electronic rack.

The holder for the electronic rack also includes a second end of the holder having a third blind-mate connector to be coupled to a fourth blind-mate connector at a second engagement interface. The fourth blind-mate connector is mounted at a predetermined location on a rack manifold. The third blind-mate connector and the fourth blind-mate connector are coupled in response to the holder moving to the second position in response to contact with the electronic rack. The holder for the electronic rack additionally includes a fluid channel disposed within the holder to provide a fluid communication between the room manifold and the rack manifold when the holder is in the second position.

In one embodiment, the first engagement interface and the second engagement interface are simultaneously engaged to connect the rack manifold to the room manifold in response to the holder moving to the second position in response to contact with the electronic rack. The holder extends substantially downwardly parallel to the panel when the holder is in the second position.

In one embodiment, the room manifold includes a supply room manifold to distribute heat removal liquid from an external heat removal system to the rack manifold via the fluid channel when the holder is in the second position. In another embodiment, the room manifold includes a return room manifold to transfer the heat removal liquid from the rack manifold to the external heat removal system via the fluid channel when the holder is in the second position.

According to an embodiment of the present disclosure, the holder for the electronic rack further includes a compression spring to be coupled to the panel and a first end of the holder to maintain the holder in the first position, such that the first end of the holder is maintained at a predetermined angle with respect to the panel. The compression spring includes a stopper to stop an electronic rack from exerting an excessive amount of force on the panel and to prevent an excessive stress from being applied to the first engagement interface and the second engagement interface when the holder is in the second position.

In some embodiments, a first portion of the fluid channel extends downwardly from the first engagement interface and a second portion of the fluid channel substantially perpendicular to the first portion of the fluid channel. The second portion of the fluid channel extends horizontally towards the second engagement interface when the holder is in the second position.

According to one embodiment, a first portion of the fluid channel extends downwardly from the first interface and a second portion of the fluid channel substantially perpendicular to the first portion of the fluid channel. The second portion of the fluid channel extends horizontally towards the second engagement interface when the frame is in the second position. A third portion of the fluid channel connects the first portion of the fluid channel and the second portion of the fluid channel. The third portion of the fluid channel is connected to the first portion of the fluid channel and the second portion of the fluid channel at a predetermined angle.

In one embodiment, the predetermined location of the fourth blind-mate connector being mounted on the rack manifold is located at a top of the rack manifold. In another embodiment, the predetermined location of the fourth blind-mate connector being mounted on a rack manifold on the rack manifold is located at a side (e.g., rear side) of the rack manifold.

In some embodiments, the fluid channel extends downwardly when the holder is in the second position, such that the second engagement interface is positioned at the predetermined location.

In one embodiment, the rack manifold includes a supply rack manifold in fluid communication with the supply room manifold when the holder is in the second position. The supply rack manifold is connected to an information technology (IT) equipment via a blind-mate connection. In another embodiment, the rack manifold includes a return rack manifold in fluid communication with the return room manifold when the holder is in the second position. The return rack manifold is connected to an IT equipment via a blind-mate connection.

According to another aspect, the above system can be implemented in a data center. The data center includes a room manifold and multiple electronic racks positioned in multiple rows. Each of the multiple electronic racks is coupled to the room manifold via a holder.

FIG. 1 is a block diagram illustrating a data center system 100 according to one embodiment of the present disclosure. In this example, FIG. 1 shows a top view of at least a portion of a data center. Referring to FIG. 1, according to one embodiment, the data center system 100 includes rows of electronic racks of IT components, equipment or instruments 101-102, such as, for example, computer servers that provide data services to a variety of clients. In this embodiment, the data center system 100 includes electronic racks, such as electronic racks 110A-110N, arranged in row 101 and row 102. However, more or fewer rows of electronic racks may be implemented. Typically, rows 101-102 are aligned in parallel with frontends facing each other and backends facing away from each other, forming aisle 103 in between to allow an administrative person walking therein. However, other configurations or arrangements may also be applied.

In one embodiment, each of the electronic racks (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a backend of the electronic rack. The back panel includes a heat removal liquid manifold assembly to provide heat removal liquid (also referred to as cooling liquid or coolant) from an external heat removal system 120 to remove heat from the server blades. Each server blade can be inserted and removed from a corresponding server slot from a frontend of the electronic rack. Heat removal system 120 may be a chiller system with an active refrigeration cycle. Alternatively, heat removal system 120 can include but not limited to evaporative cooling, free air, rejection to large thermal mass, and waste heat recovery designs, as will be understood by those skilled in the art.

In one embodiment, each of the electronic racks in rows 101-102 includes a heat removal liquid manifold, a number of server blades contained in a number of server blade slots respectively, and a coolant distribution unit (CDU). The heat removal liquid manifold is to provide heat removal liquid to each of the server blades. Each of the server blades is to receive heat removal liquid from the heat removal liquid manifold, to remove at least a portion of the heat generated by an IT component of the server blade using the heat removal liquid manifold, and to transmit warmer liquid carrying the heat exchanged from the IT component back to the heat removal liquid manifold. The CDU is configured to receive data representing a workload of the IT components of the server blades and to control a liquid flow rate of the heat removal liquid supplied to the heat removal liquid manifold based on the workload of the IT components of the server blades.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via return line 131 back to heat removal system 120. Liquid supply/return lines 131-132 are referred to as data center liquid supply/return lines (e.g., global liquid supply lines), which supply heat removal liquid to all of the electronic racks of rows 101-102.

Figure 2:
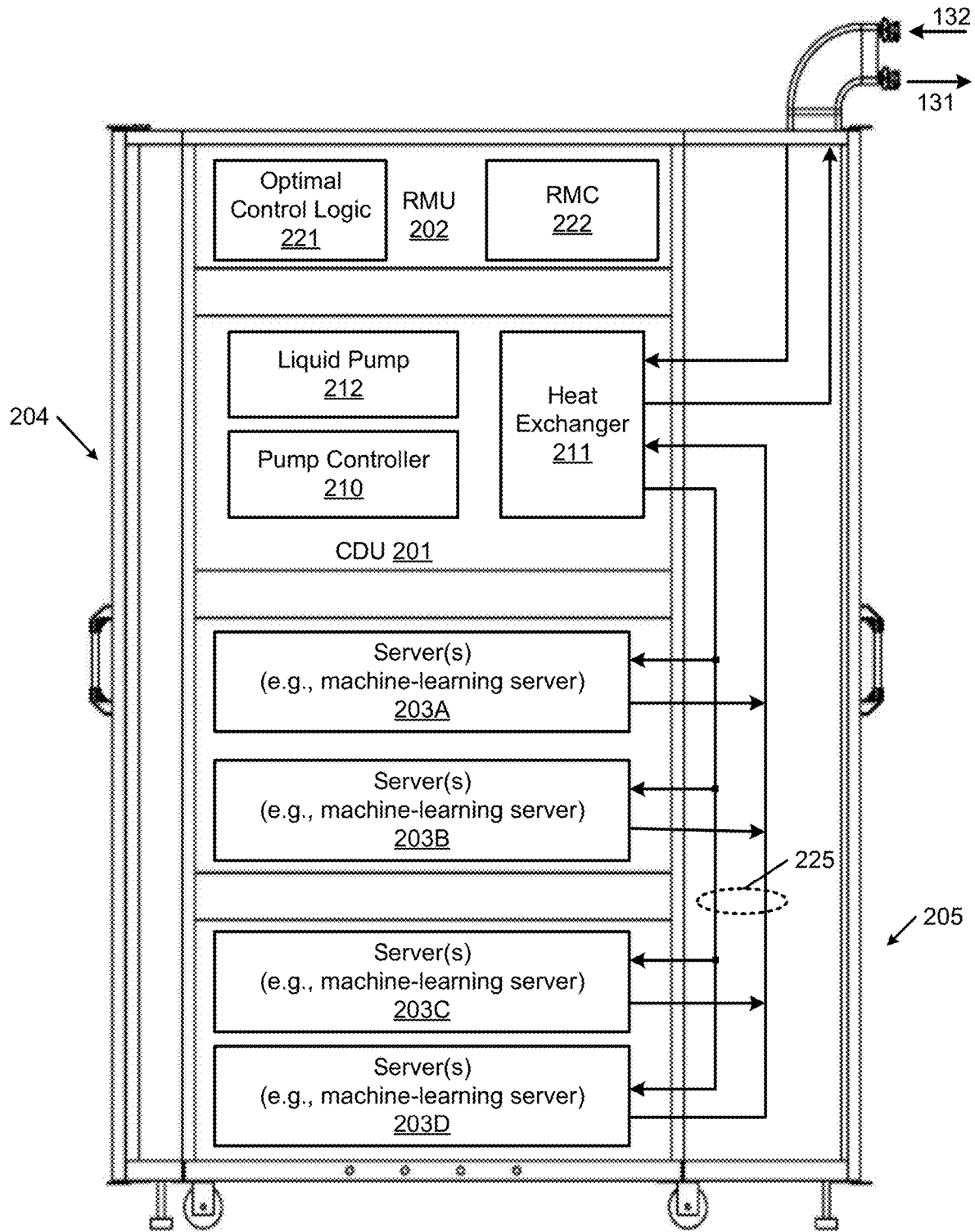
FIG. 2 is a block diagram illustrating an example of an electronic rack according to one embodiment.

FIG. 2 is a block diagram illustrating a side view of an electronic rack according to one embodiment of the invention. Electronic rack 200 may represent any of the electronic racks of rows 101-102 of FIG. 1 such as electronic racks 110A-110N. Referring to FIG. 2, in one embodiment, electronic rack 200 includes CDU 201, RMU 202, and one or more server blades 203A-203D, collectively referred to as server blades 203. Server blades 203 can be inserted into an array of server slots respectively from frontend 204 of electronic rack 200. Note that although there are only four server blades 203A-203D shown in FIG. 2, more or fewer server blades may be maintained within electronic rack 200. Also note that the particular positions of CDU 201, RMU 202, and server blades 203 are shown for the purpose of illustration only; other arrangements or configurations of CDU 201, RMU 202, and server blades 203 may also be implemented. Further, the front door disposed on frontend 204 and the back door disposed on backend 205 are optional. In some situations, there may no door on frontend 204 and/or backend 205.

In one embodiment, CDU 201 includes heat exchanger 211, liquid pump 212, and pump controller 210. Heat exchanger 211 may be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 may be disposed or mounted on backend 205 of electronic rack 200. In addition, heat exchanger 211 further includes a second tube having a second pair of liquid connectors coupled to liquid manifold 225, which may include a supply manifold to supply cooling liquid to server blades 203 and a return manifold to return warmer liquid back to CDU 201. The processors may be mounted on the cold plates, where the cold plates include a liquid distribution channel embedded therein to receive the cooling liquid from the liquid manifold 225 and to return the cooling liquid carrying the heat exchanged from the processors back to the liquid manifold 225.

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 200 further includes RMU 202 configured to provide and manage power supplied to server blades 203 and CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimal control logic 221 and rack management controller (RMC) 222. The optimal control logic 221 is coupled to at least some of server blades 203 to receive operating status of each of the server blades 203, such as processor temperatures of the processors, the current pump speed of the liquid pump 212, and liquid temperature of the cooling liquid, etc. Based on this information, optimal control logic 221 determines an optimal pump speed of the liquid pump 212 by optimizing a predetermined objective function, such that the output of the objective function reaches the maximum while a set of predetermined constraints is satisfied. Based on the optimal pump speed, RMC 222 is configured to send a signal to pump controller 210 to control the pump speed of liquid pump 212 based on the optimal pump speed.

Figure 3B:
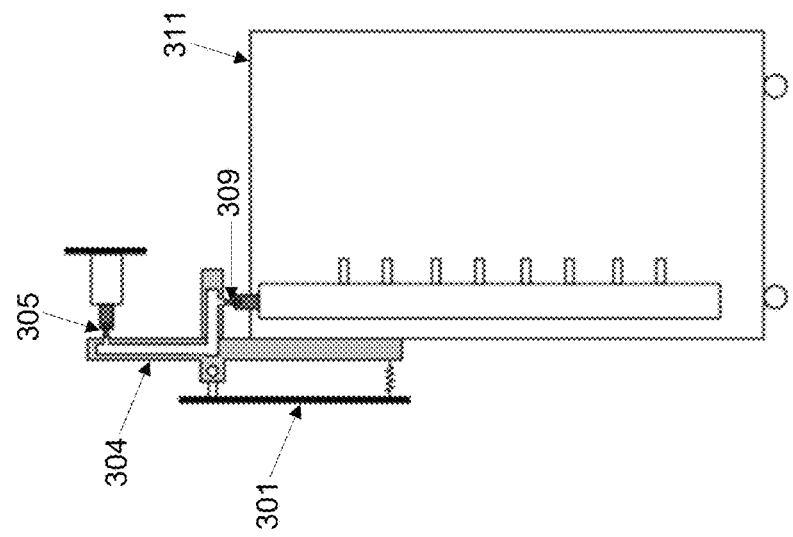
FIGS. 3A and 3B are block diagrams illustrating an example of a liquid cooling blind-mate connection between a rack manifold and a room manifold via a holder before an electronic rack is pushed into a designated position and after the electronic rack is pushed into a designated position and the blind-mating is engaged according to an embodiment.
Figure 3A:
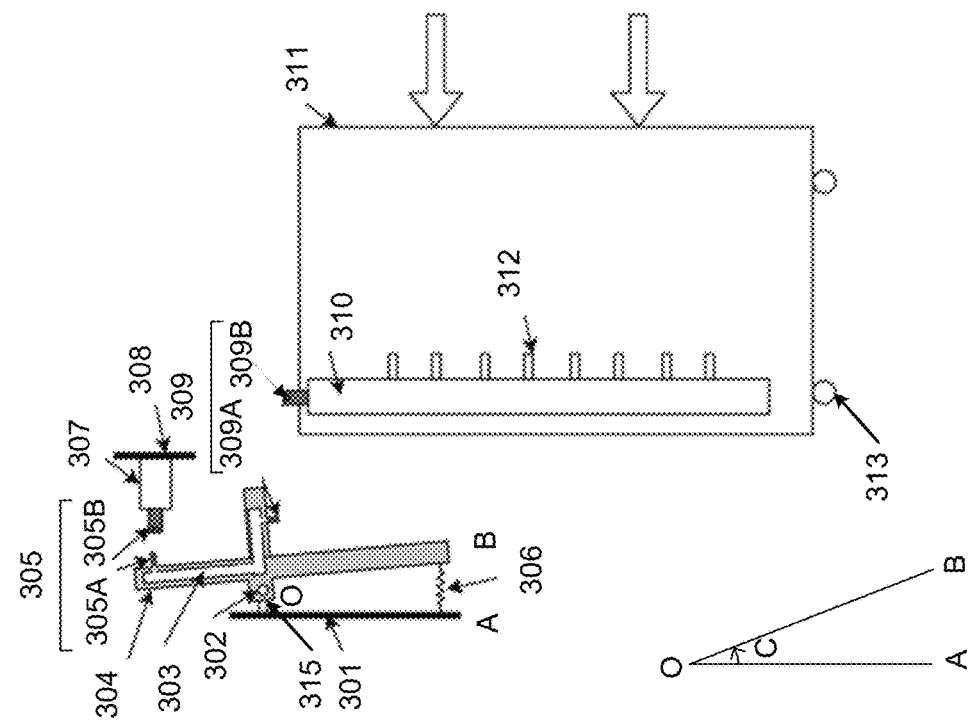

FIG. 3A is a block diagram illustrating an example of a simplified electronic rack according to one embodiment. Electronic rack 311 may be implemented as a part of electronic rack 200 as shown in FIG. 2. The present disclosure is directed to a holder for an electronic rack 311, for example as illustrated in FIG. 3A, according to an embodiment. The holder employs a complete blind-mate interface design from a server chassis (e.g., a rack manifold) to a room fluid supply/return system (e.g., a room manifold), thereby eliminating flexible hoses and barbed fitting connections. Additionally, a self-engaging mechanism can be implemented to couple complete blind-mate interfaces via the holder between the rack manifold and the room manifold. As an electronic rack is pushed into a designated position in a data center, for example, the two blind-mate interfaces are coupled simultaneously.

Accordingly, the rack manifold is coupled to a holder, and the room manifold is coupled to the holder via the self-engaging mechanism and the holder. Further, a full segregation design between the room manifold with multiple electronic racks can be implemented via the holder. During engaging and disengaging operation for a selected electronic rack in the data center, the disturbing on the room manifold does not affect the connection integrity for the other electronic racks. Therefore, the engaging and disengaging operation for the selected electronic rack is isolated.

Before a liquid-cooled electronic rack is pushed into a designated position in an IT room, the holder is in a first position. In the first position, the lower arm (e.g., lower end) of the holder is tilted by a predetermined angle (e.g., 5° (degrees)) due to the resistance of a compression spring. With all the other degrees of freedom being constrained, the holder can only rotate about the pivot point. When the liquid-cooled electronic rack is pushed into the designated position, the electronic rack contacts and pushes the portion of the holder towards the panel or wall of the IT room, compressing the compression spring. Accordingly, the holder is in a second position. In the second position, the blind-mate connectors on the upper arm and middle arm of the holder are coupled onto the blind-mate connector pairs positioned on the rack manifold and room manifold, respectively.

In one embodiment, referring to FIG. 3A, a holder 304 includes a pivot point 302 disposed on a portion of the holder 304. The pivot point 302 is to be coupled to a pivot connector 315 on a panel 301 to pivotally move the holder 304 between a first position 300 and a second position 320. Panel 301 may be a back panel that receive the electronic rack pushed into a corresponding rack slot as shown in FIG. 1. The holder 304 also includes a compression spring 306 to be coupled to the panel 301 and an end (in this example, a lower end) of the holder 304 to maintain the holder 304 in the first position 300, such that the end of the holder 304 is maintained at a predetermined angle C with respect to the panel 301. In one embodiment, the predetermined angle is approximately 5° (degrees). Before a liquid-cooled electronic rack is pushed into a designated position in the data center, the first end of the holder 304 is tilted indicated by B by an angle (e.g., 5° (degrees)), from a point 0 with respect to a vertical position indicated by A (parallel to the panel 301), due to a resistance from a compression spring 306.

Additionally, the holder 304 includes a first end, in this example, an upper end) of the holder 304 having a first blind-mate connector 305A to be coupled to a second blind-mate connector 305B at a first engagement interface 305. The first blind-mate connector 305A of the holder 304 can be either female or male. Similarly, the second blind-mate 305B of the holder 304 can be either female or male.

The second blind-mate connector 305B is mounted on a room manifold 307. The room manifold is mounted on a panel 308 or a wall in an IT room. The room manifold 307 is a part of the IT room fluid supply/return system. The room manifold 307 supplies and receives fluid for multiple racks in an IT room, therefore it has a longer size. The room manifold 307 is positioned not to be moveable and fixed on a wall or a panel 308 in the IT room. The first blind-mate connector 305A and the second blind-mate connector 305B are coupled in response to the holder 304 moving to the second position 320 in response to contact with the electronic rack 311.

The holder 304 further includes a second end of the holder 304 having a third blind-mate connector 309A to be coupled to a fourth blind-mate connector 309B at a second engagement interface 309. In this example, the second end of holder 304 is located in the relatively middle portion of holder 304 between the upper end and the lower end. The fourth blind-mate connector 309B is mounted at a predetermined location on a rack manifold 310. The third blind-mate connector 309A and the fourth blind-mate connector 309B are coupled in response to the holder 304 moving to the second position 320 in response to contact with the electronic rack 311, as shown in FIG. 3B. The third blind-mate connector 309A of the holder 304 can be either female or male. Similarly, the fourth blind-mate 309B of the holder 304 can be either female or male. As illustrated, the holder 304 also includes a fluid channel 303 disposed within the holder 304 providing a fluid communication between the room manifold 307 and the rack manifold 310 when the holder 304 is in the second position 320.

As further illustrated in FIG. 3A, in some embodiments, the first engagement interface 305 and the second engagement interface 309 are simultaneously engaged to connect the rack 310 manifold to the room manifold 307 in response to the holder 304 moving to the second position 320 in response to contact with the electronic rack 311. Accordingly, the room manifold 307 and the rack manifold 310 are coupled, thereby providing a fluid communication between the room manifold 307 and the rack manifold 310 when the holder 304 is in the second position 320.

When an electronic rack 311 (e.g., a liquid-cooled electronic rack) is engaged or pushed into a designated position, the electronic rack 311 then contacts and pushes the lower portion of the holder 304 towards the panel 301, compressing compression spring 306. With all the other degrees of freedom being constrained, the holder 304 can only rotate about the pivot point 302. At the same time, the first blind-mate connector 305A on the first end of the holder (e.g., proximate the upper arm of the holder) and the third blind-mate connector 309A on the second end of the holder (e.g., proximate a middle arm of the holder 304) are coupled simultaneously onto the second blind-mate connector 305B and the fourth first blind-mate connector 309B positioned on the room manifold 307 and the rack manifold 310, respectively.

To make sure the engagement of the electronic rack into the designated position is complete, the electronic rack is pushed into a designated position completely and the wheels 313 of the electronic rack 311 are in a lock mode. As a result, no flexible hoses are needed for this type of connection. Because of the heavy weight of the electronic rack 311, once the electronic rack 311 has been pushed into the designated position by the operator, for example, the compression spring 306 itself pushes against the electronic rack 311, thereby keeping the electronic rack 311 from moving. The compression spring 306 includes a stopper (e.g., hard stopper mechanism, not shown). During a compression spring 306 compression, the stopper prevents the compression spring 306 from being excessively compressed by the force exerted by the electronic rack 311. In this manner, an excessive mechanical stress on the blind-mate interfaces coupling is avoided.

In some embodiments, the holder 304 extends substantially downwardly parallel to the panel 301 when the 304 holder is in the second position 320. In this manner, the first blind-mate connector 305A on the first end of the holder 304 and the third blind-mate connector 309A on the second end of the holder 304 are coupled simultaneously onto the second blind-mate connector 305B and the fourth blind-mate connector 309B positioned on the room manifold 307 and the rack manifold 310, respectively. In the second position 320, the holder 304 pushes against the compression spring 306. Accordingly, the compression spring 306 pushes against the electronic rack 311, thereby keeping the electronic rack 311 from moving.

The room manifold 308 is a part of the room fluid supply and return system. The room manifold 308 supplies and receives fluid for multiple racks in an IT room, therefore it has a longer size. The room manifold 308 is fixed on a wall or panel 301 in the IT room. In some embodiments, the room manifold 308 includes a supply room manifold to distribute heat removal liquid from an external heat removal system to the rack manifold 310 via the fluid channel when the holder 304 is in the second position 320. In another embodiment, the room manifold 308 includes a return room manifold to transfer the heat removal liquid from the rack manifold 312 to the external heat removal system via the fluid channel when the holder 304 is in the second position 320. The rack manifold 310 supplies and receives fluid to multiple cooling modules positioned in servers in the electronic rack 311, via blind-mate interfaces 312. The rack manifold 310 is fastened to the electronic rack 311 so that the rack manifold 310 remains in its position when the blind-mate is engaged. The top port of rack manifold 310 cuts through the top surface of the electronic rack 311.

In some embodiments, the compression spring 306 includes a stopper (e.g., stopping mechanism, not shown) to stop an electronic rack 311 from exerting an excessive amount of force on the panel 301 and to prevent an excessive stress from being applied to the first engagement interface 305 and the second engagement interface 309 when the holder 304 is in the second position 320.

Figure 3C:
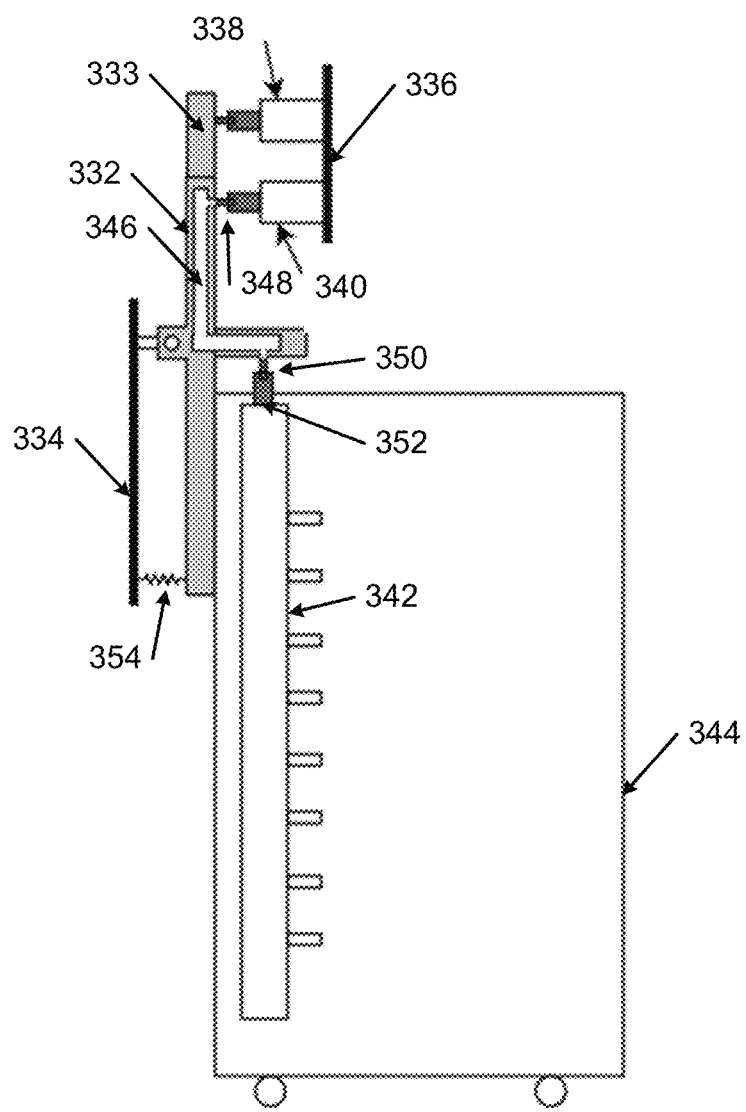
FIG. 3C is a block diagram illustrating an example of a liquid cooling blind-mate connection with supply and return room manifolds being connected to an electronic rack according to one embodiment.

FIG. 3C is a side view illustration of a supply room manifold 340 and a return room manifold 338 coupled to an electronic rack 344 when the holder 332 has moved to the second position. The supply room manifold 340 and the return room manifold 338 are connected to a panel 336. In this side view illustration, the supply and return rack manifolds of the rack manifold 342 and their associated holders 332, 333 are overlapping. The holder 332 includes a compression spring 354 to be coupled to the panel 334.

Referring to FIG. 3C, in one embodiment, a first portion of the fluid channel 346 extends downwardly from the first engagement interface 348. A second portion of the fluid channel 346 substantially perpendicular to the first portion of the fluid channel 346. The second portion of the fluid channel 346 extends horizontally towards the second engagement interface 350 when the holder 332 is in the second position.

In one embodiment shown in FIG. 3C, the predetermined location 352 of the fourth blind-mate connector being mounted on the rack manifold 342 is located at a top of the rack manifold 342. The predetermined location includes a top port that can eliminate the air bubble accumulation on the top side of the rack manifold because the fluid flow is not required to make a 90° turn.

Figure 6:
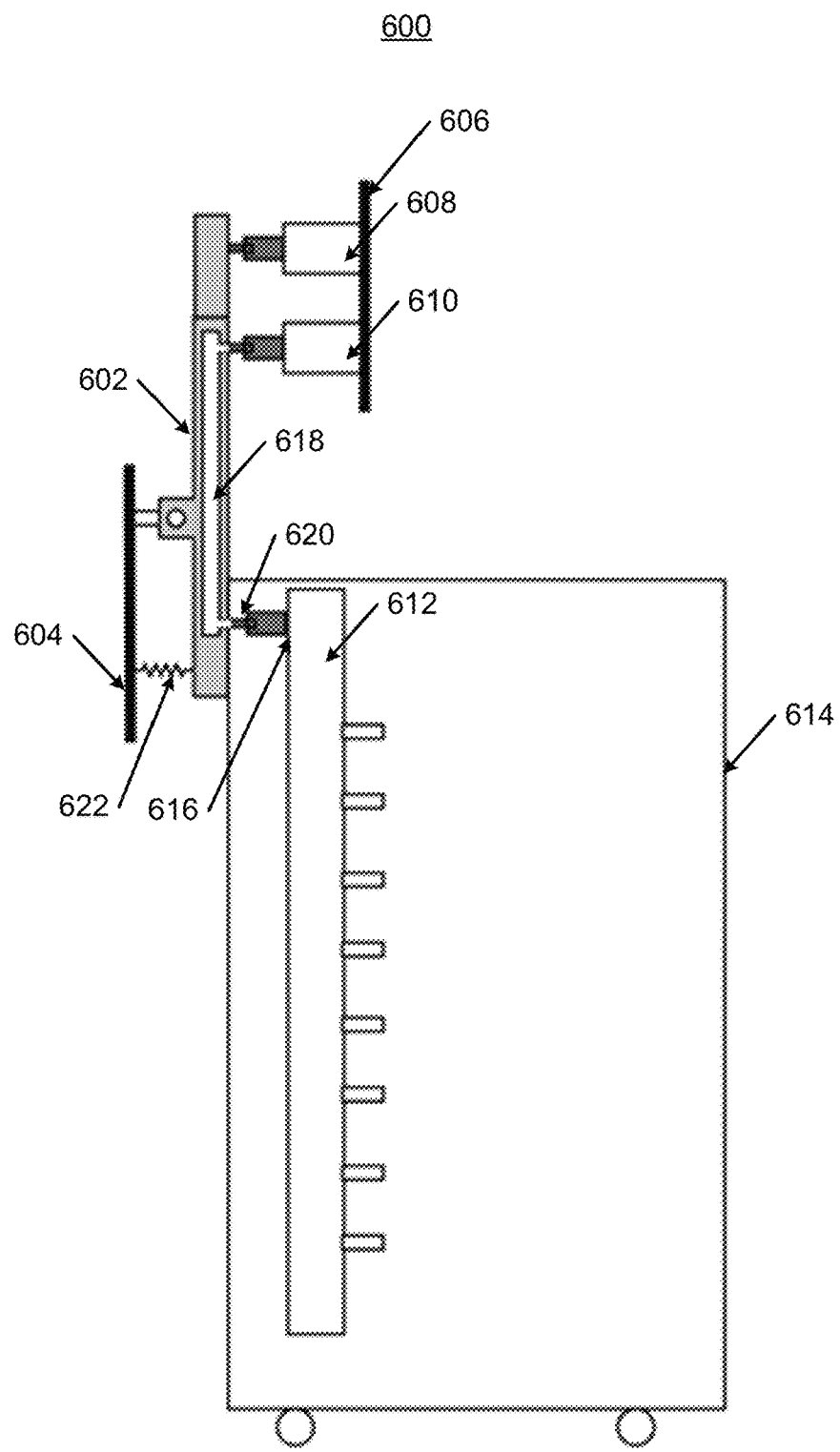
FIG. 6 is a block diagram illustrating an example of a liquid cooling blind-mate connection between a rack manifold and a room manifold via a holder according to one embodiment.

FIG. 6 is a side view illustration of a supply room manifold 610 and a return room manifold 608 coupled to an electronic rack 614 when the holder 602 has moved to the second position. The supply room manifold 610 and the return room manifold 608 are connected to a panel 606. The holder 602 includes a compression spring 622 to be coupled to the panel 604. In an embodiment 600 illustrated in FIG. 6, the predetermined location 616 of the fourth blind-mate connector being mounted on the rack manifold 612 of the electronic rack 614 is located at a rear side of the rack manifold 612. As further illustrated in FIG. 6, the fluid channel 618 extends downwardly when the holder 602 is in the second position, such that the second engagement interface 620 is positioned at the predetermined location.

Figure 4:
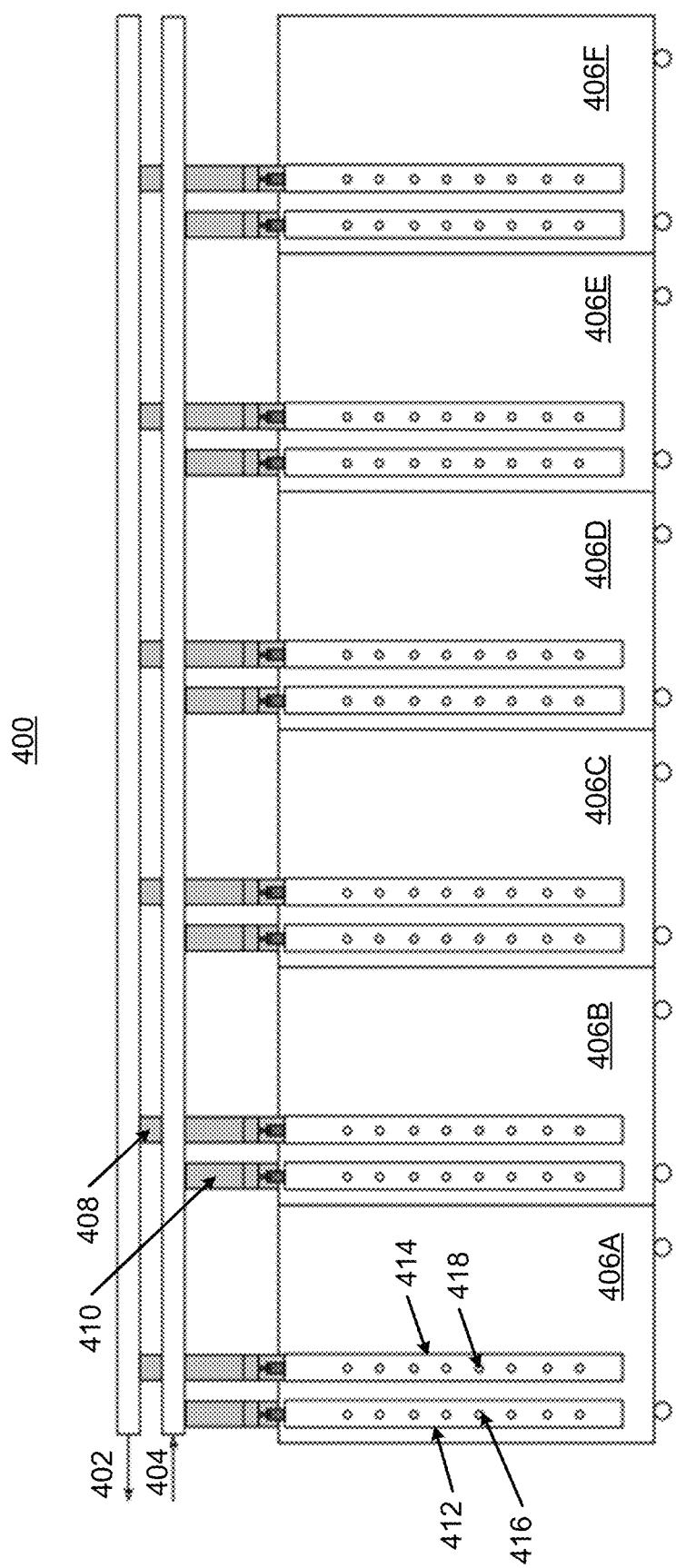
FIG. 4 is a block diagram illustrating an example of supply and return room manifolds being connected to a row of electronic racks according to one embodiment.

FIG. 4 illustrates a data center 400. The data center 400 includes a room manifold 402, 404 and electronic racks 406, such as electronic racks 406A-406F positioned in rows. Each of the electronic racks 406 is coupled to the room manifold 402, 404 via holders 408, 410. As further illustrated, the room manifold 402, 404 includes a supply room manifold 404 and a return room manifold 402 being connected to a row of electronic racks 406, such as electronic racks 406A-406F in the data center 400. In one embodiment, the rack supply manifold and rack return manifold of each electronic rack are coupled to the room supply manifold and room return manifold via a pair of holders as described above respectively.

Referring to FIG. 4, in one embodiment, the rack manifold includes a supply rack manifold 412 in fluid communication with the supply room manifold 404 when the holder 410 is in the second position. The supply rack manifold 412 is connected to an IT equipment via a blind-mate connection 416. In some embodiments, the rack manifold includes a return rack manifold 414 in fluid communication with the return room manifold 402 when the holder 408 is in the second position, the return rack manifold 414 being connected to an IT equipment via a blind-mate connection 418.

The supply rack manifold 412 and return rack manifold 414 are placed parallel in each of the electronic racks 406 for blind-mate connections to the IT equipment such as servers. In one embodiment, for example, return rack manifold 414 is longer than the supply rack manifold 412. For a row of electronic racks 406 shown in FIG. 4, supply room manifold 404 and return room manifold 402 are placed at different heights.

In one embodiment as illustrated in FIG. 4, each of the electronic racks 406 is coupled to the room manifold 402, 404 via holders 408, 410.

As illustrated in FIG. 4, each of the electronic racks 406 includes rack manifolds 412, 414 positioned side by side. Each of the rack manifolds 412, 414 has a different length. Each of the rack manifolds 412, 414 is in fluid communication with the room manifold 402, 404 when the holder 408, 410 is in the second position.

The rack manifolds 412, 414 are connected to the room manifold 402, 404 including a supply room manifold 404 and a return room manifold 402. As further illustrated in FIG. 4, in one embodiment, the supply room manifold 404 and the return room manifold 402 are positioned at a different height. The supply room manifold 404 is positioned to distribute heat removal liquid from an external heat removal system to the rack manifold 412 via the fluid channel when the holder is in the second position. The return room manifold 402 is positioned to transfer the heat removal liquid from the rack manifold 414 to the external heat removal system via the fluid channel when the holder is in the second position.

Referring back to FIG. 5 showing a side view illustration of a supply room manifold 510 and a return room manifold 508 coupled to an electronic rack 514 when the holder 501 has moved to the second position. The supply room manifold 510 and the return room manifold 508 are connected to a panel 506. The holder 501 includes a compression spring 520 to be coupled to the panel 504.

Figure 5:
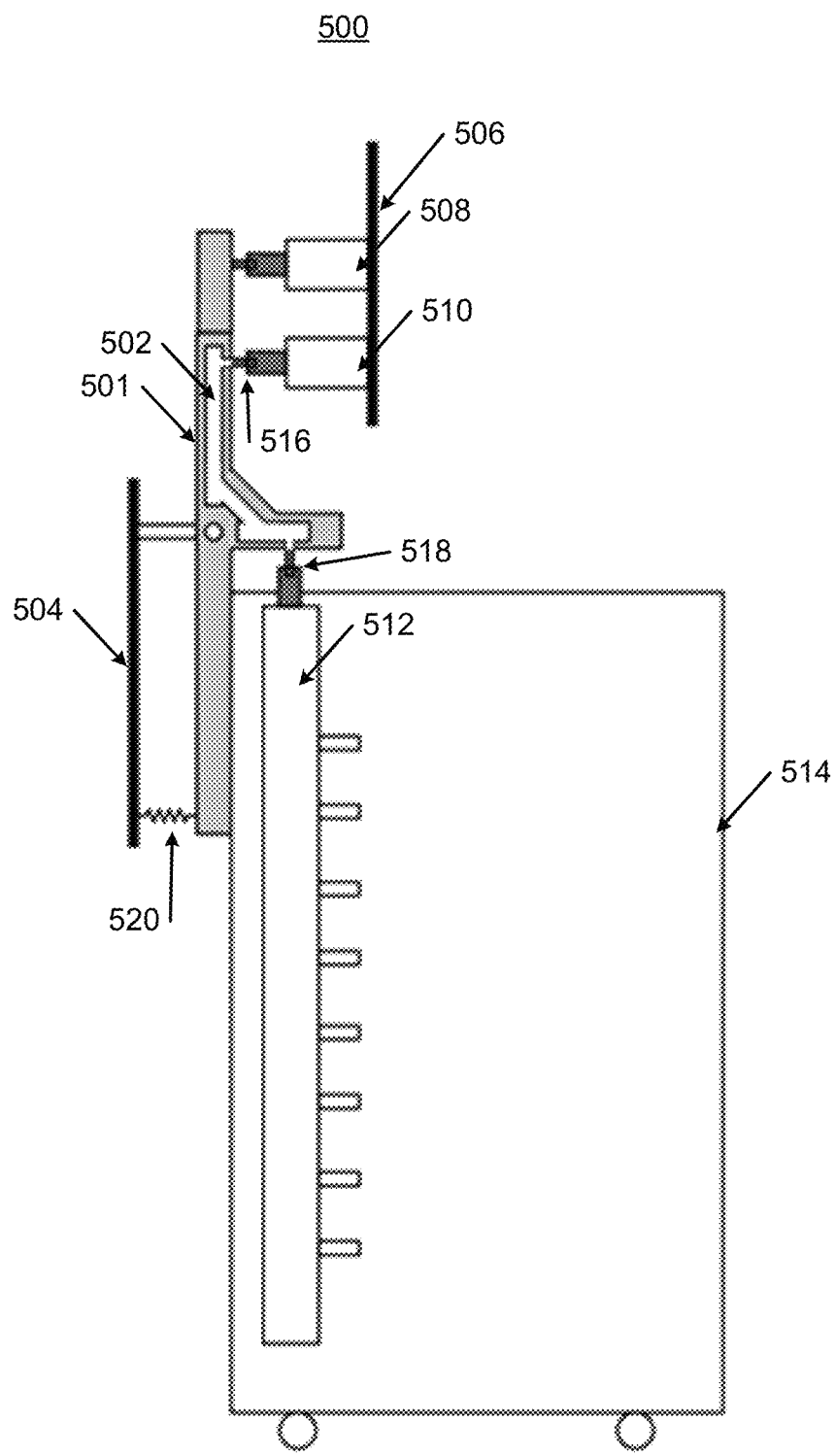
FIG. 5 is a block diagram illustrating an example of a liquid cooling blind-mate connection between a rack manifold and a room manifold via a holder according to one embodiment.

As shown in another embodiment 500 in FIG. 5, a first portion of the fluid channel 502 extends downwardly from the first interface 516. A second portion of the fluid channel 502 is substantially perpendicular to the first portion of the fluid channel 502. The second portion of the fluid channel 502 extends horizontally towards the second engagement interface 518 when the holder 501 is in the second position. A third portion of the fluid channel 502 connects the first portion of the fluid channel 502 and the second portion of the fluid channel 502. The third portion of the fluid channel 502 is connected to the first portion of the fluid channel 502 and the second portion of the fluid channel 502 at a predetermined angle. In this configuration, the impedance or resistance of a flow movement inside the fluid channel can be reduced.

In one embodiment (e.g., shown in FIG. 5), the predetermined location of the fourth blind-mate connector being mounted on each of the rack manifold 512 is located at a top of each of the rack manifold 512. In another embodiment shown in FIG. 6, the predetermined location 616 of the fourth blind-mate connector being mounted on each of a rack manifold 612 is located at a rear side of each of the rack manifold 614.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A holder for connecting a rack manifold of an electronic rack and a room manifold of a data center room to provide liquid cooling to the electronic rack, the holder comprising:
a pivot point coupled to a pivot connector on a panel to pivotally move the holder between a first position and a second position;
a first end of the holder having a first blind-mate connector coupled to a second blind-mate connector at a first engagement interface, the second blind-mate connector being mounted on the room manifold, the first blind-mate connector and the second blind-mate connector being coupled in response to the holder moving to the second position in response to contact with the electronic rack;
a second end of the holder having a third blind-mate connector coupled to a fourth blind-mate connector at a second engagement interface, the fourth blind-mate connector being mounted at a predetermined location on a rack manifold, the third blind-mate connector and the fourth blind-mate connector being coupled in response to the holder moving to the second position in response to contact with the electronic rack; and
a fluid channel disposed within the holder to provide a fluid communication between the room manifold and the rack manifold when the holder is in the second position.

2. The holder of claim 1, wherein the first engagement interface and the second engagement interface are simultaneously engaged to connect the rack manifold to the room manifold in response to the holder moving to the second position in response to contact with the electronic rack.

3. The holder of claim 1, wherein the holder extends substantially downwardly parallel to the panel when the holder is in the second position.

4. The holder of claim 1, wherein the room manifold is a supply room manifold to distribute heat removal liquid from an external heat removal system to the rack manifold or a return room manifold to transfer the heat removal liquid from the rack manifold to the external heat removal system.

5. The holder of claim 1, further comprising a compression spring coupled to the panel and a third end of the holder to maintain the holder in the first position, such that the third end of the holder is maintained at a predetermined angle with respect to the panel.

6. The holder of claim 5, wherein the compression spring includes a stopper to stop the electronic rack from exerting an excessive amount of force on the panel and to prevent an excessive stress from being applied to the first engagement interface and the second engagement interface when the holder is in the second position.

7. The holder of claim 1, wherein a first portion of the fluid channel extends downwardly from the first engagement interface, a second portion of the fluid channel substantially perpendicular to the first portion of the fluid channel, the second portion of the fluid channel extends horizontally towards the second engagement interface when the holder is in the second position.

8. A data center, comprising:
a room manifold; and
a plurality of electronic racks positioned in one or more rows, each of the plurality of electronic racks being coupled to the room manifold via a holder, wherein the holder comprises:
a pivot point coupled to a pivot connector on a panel to pivotally move the holder between a first position and a second position,
a first end of the holder having a first blind-mate connector coupled to a second blind-mate connector at a first engagement interface, the second blind-mate connector being mounted on the room manifold, the first blind-mate connector and the second blind-mate connector being coupled in response to the holder moving to the second position in response to contact with each of the plurality of electronic racks,
a second end of the holder having a third blind-mate connector coupled to a fourth blind-mate connector at a second engagement interface, the fourth blind-mate connector being mounted at a predetermined location on a rack manifold, the third blind-mate connector and the fourth blind-mate connector being coupled in response to the holder moving to the second position in response to contact with each of the plurality of electronic racks, and
a fluid channel disposed within the holder to provide a fluid communication between the room manifold and the rack manifold when the holder is in the second position.

9. The data center of claim 8, wherein the first engagement interface and the second engagement interface are simultaneously engaged to connect the rack manifold to the room manifold in response to the holder moving to the second position in response to contact with each of the plurality of electronic racks.

10. The data center of claim 8, wherein the holder extends substantially downwardly parallel to the panel when the holder is in the second position.

11. The data center of claim 8, wherein the room manifold is a supply room manifold to distribute heat removal liquid from an external heat removal system to the rack manifold or a return room manifold to transfer the heat removal liquid from the rack manifold to the external heat removal system.

12. The data center of claim 8, wherein the holder further comprises a compression spring coupled to the panel and a third end of the holder to maintain the holder in the first position, such that the third end of the holder is maintained at a predetermined angle with respect to the panel.

13. The data center of claim 12, wherein the compression spring includes a stopper to stop each of the plurality of electronic racks from exerting an excessive amount of force on the panel and to prevent an excessive stress from being applied to the first engagement interface and the second engagement interface when the holder is in the second position.

14. The data center of claim 8, wherein a first portion of the fluid channel extends downwardly from the first engagement interface, a second portion of the fluid channel substantially perpendicular to the first portion of the fluid channel, the second portion of the fluid channel extends horizontally towards the second engagement interface when the holder is in the second position.

* * * * *